US012588329B2

(12) United States Patent
Ding et al.

(10) Patent No.: US 12,588,329 B2
(45) Date of Patent: Mar. 24, 2026

(54) HIGH-DENSITY MICRO-LED ARRAYS WITH REFLECTIVE SIDEWALLS

(71) Applicant: Applied Materials, Inc., Santa Clara, CA (US)

(72) Inventors: Kai Ding, Cupertino, CA (US); Lisong Xu, San Jose, CA (US); Mingwei Zhu, San Jose, CA (US); Zhiyong Li, Foster City, CA (US); Hou T. Ng, Campbell, CA (US); Sivapackia Ganapathiappan, Los Altos, CA (US); Nag Patibandla, Dublin, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/413,013

(22) Filed: Jan. 15, 2024

(65) Prior Publication Data

US 2024/0186458 A1     Jun. 6, 2024

Related U.S. Application Data

(63) Continuation of application No. 18/305,852, filed on Apr. 24, 2023.

(Continued)

(51) Int. Cl.
*H10H 20/841*     (2025.01)
*H01L 25/16*     (2023.01)
(Continued)

(52) U.S. Cl.
CPC ......... *H10H 20/841* (2025.01); *H01L 25/167* (2013.01); *H10H 20/011* (2025.01);
(Continued)

(58) Field of Classification Search
CPC ....... H01L 33/46; H01L 33/405; H01L 33/10; H01L 25/167; H10H 20/841;
(Continued)

(56) References Cited

U.S. PATENT DOCUMENTS 8,933,433 B2     1/2015  Higginson
9,111,464 B2     8/2015  Bibl
(Continued)

FOREIGN PATENT DOCUMENTS

KR     20130080301 A     7/2013
KR     20200057216 A     5/2020

OTHER PUBLICATIONS

Application No. PCT/US2023/018879 , International Search Report and Written Opinion, Mailed On Aug. 16, 2023, 12 pages.

*Primary Examiner* — Alonzo Chambliss
(74) *Attorney, Agent, or Firm* — Kilpatrick Townsend & Stockton LLP

(57) ABSTRACT

Micro-LED structures include an LED epilayer that may be formed before the micro-LED structure is coupled to a backplane substrate. In order to prevent light leakage and maximize light output, the sidewalls and other surfaces of the LED epilayer may be coated with a reflective coating. For example, the reflective coating may include a metal layer that is electrically insulated between dielectric layers from the micro-LED electrodes. The reflective coating may also be formed using multiple layers in a distributed Bragg reflector configuration. This reflective coating may be formed during the LED fabrication process before the micro-LED structure is coupled to the backplane. The pixel isolation structures on the backplane may also include a reflective coating that is applied above the LED epilayers.

16 Claims, 12 Drawing Sheets

Related U.S. Application Data

(60) Provisional application No. 63/333,702, filed on Apr. 22, 2022.

(51) Int. Cl.

| | |
|---|---|
| *H10H 20/01* | (2025.01) |
| *H10H 20/825* | (2025.01) |
| *H10H 20/856* | (2025.01) |
| *H10H 29/14* | (2025.01) |
| *H10H 29/80* | (2025.01) |
| *H10K 59/12* | (2023.01) |
| *H10K 59/122* | (2023.01) |
| *H10K 59/35* | (2023.01) |
| *H10K 59/80* | (2023.01) |

(52) U.S. Cl.

CPC ........ *H10H 20/032* (2025.01); *H10H 20/825* (2025.01); *H10H 20/856* (2025.01); *H10H 29/142* (2025.01); *H10H 29/8421* (2025.01); *H10K 59/1201* (2023.02); *H10K 59/122* (2023.02); *H10K 59/35* (2023.02); *H10K 59/878* (2023.02); *H10H 20/034* (2025.01)

(58) Field of Classification Search

CPC .. H10K 59/122; H10K 59/1201; H10K 59/35; H10K 59/878

See application file for complete search history.

(56) References Cited

U.S. PATENT DOCUMENTS

| | | | | |
|---|---|---|---|---|
| 11,348,983 | B1 * | 5/2022 | Choung | H10K 50/844 |
| 11,476,313 | B2 * | 10/2022 | Choung | H10K 71/00 |
| 11,527,732 | B1 * | 12/2022 | Chen | H10K 59/1201 |
| 11,610,936 | B2 | 3/2023 | Ahmed | |
| 11,721,786 | B2 | 8/2023 | Keates | |
| 12,310,159 | B2 | 5/2025 | Chen | |
| 2009/0039374 | A1 * | 2/2009 | Yahata | H10H 20/8316 |
| | | | | 257/E33.023 |
| 2011/0284822 | A1 | 11/2011 | Jung et al. | |
| 2013/0052759 | A1 * | 2/2013 | Odnoblyudov | H01L 33/08 |
| | | | | 257/E33.068 |
| 2016/0218143 | A1 | 7/2016 | Chaji | |
| 2016/0372528 | A1 * | 12/2016 | Kamura | H10K 50/865 |
| 2017/0125641 | A1 | 5/2017 | Jeon et al. | |
| 2017/0167703 | A1 | 6/2017 | Cok | |
| 2017/0229430 | A1 | 8/2017 | Lai et al. | |
| 2018/0062047 | A1 | 3/2018 | Biwa et al. | |
| 2020/0357968 | A1 | 11/2020 | Lutgen | |
| 2021/0288105 | A1 | 9/2021 | Kawanishi et al. | |
| 2022/0139999 | A1 * | 5/2022 | Yeon | G09G 3/32 |
| | | | | 257/89 |
| 2022/0254952 | A1 | 8/2022 | Fabien | |
| 2022/0384516 | A1 | 12/2022 | Tan et al. | |
| 2023/0121816 | A1 * | 4/2023 | Kim | H01L 33/505 |
| | | | | 257/419 |

* cited by examiner

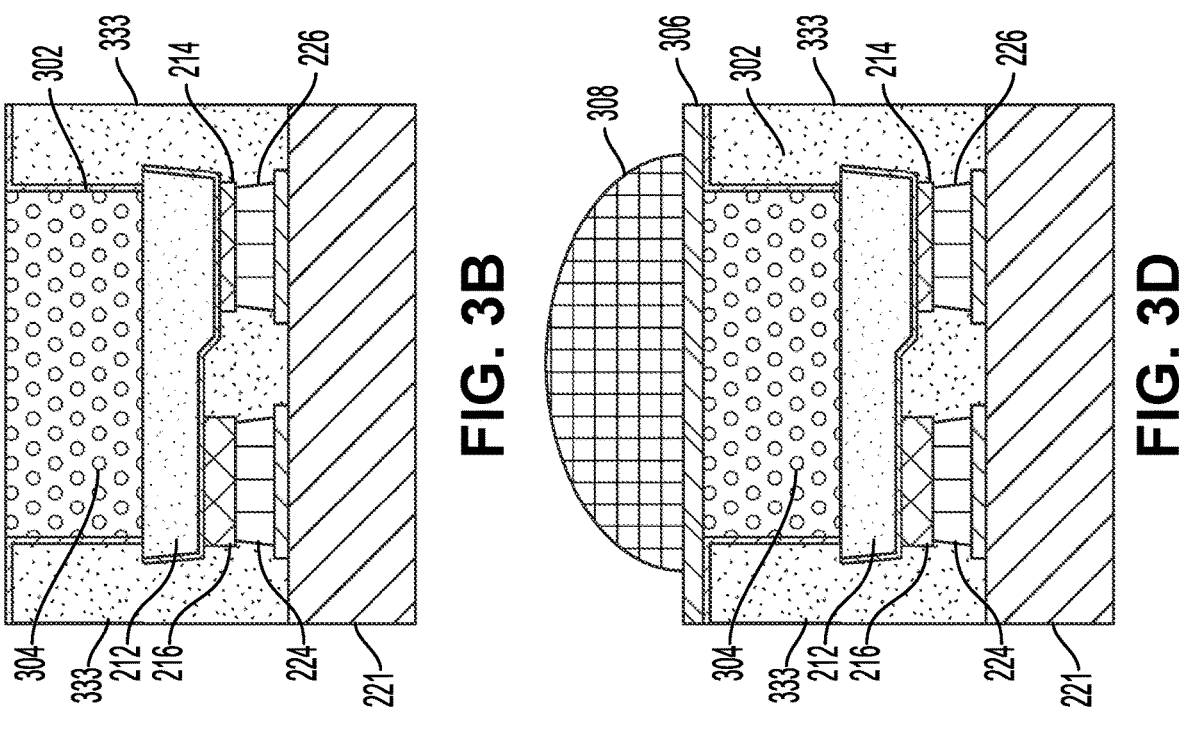
FIG. 3A
FIG. 3B
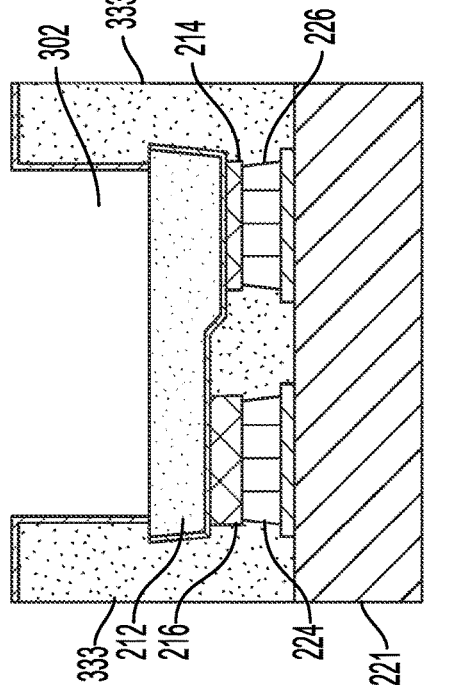
FIG. 3C
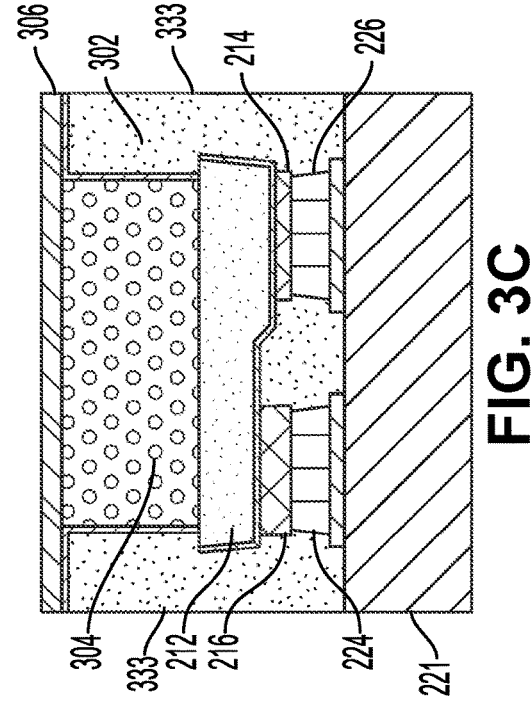
FIG. 3D

1300

1302

Form an LED epilayer on a substrate

1304

Form a reflective coating on the sidewalls of the LED epilayer

1306

Form a first electrode coupled to the first side of the LED epilayer

HIGH-DENSITY MICRO-LED ARRAYS WITH REFLECTIVE SIDEWALLS

CROSS-REFERENCE TO RELATED APPLICATIONS

This application is a continuation of U.S. patent application Ser. No. 18/305,852, filed Apr. 24, 2023, entitled, "HIGH-DENSITY MICRO-LED ARRAYS WITH REFLECTIVE SIDEWALLS," which claims the benefit of U.S. Provisional No. 63/333,702 filed on Apr. 22, 2022, entitled "HIGH-DENSITY MICRO-LED ARRAYS WITH REFLECTIVE SIDEWALLS," the entire contents of which are incorporated herein by reference.

TECHNICAL FIELD

The present technology relates to micro-light-emitting diode (LED) structures. More specifically, this disclosure describes Micro-LED arrays with reflective sidewalls to prevent light leakage and improve LED efficiency.

BACKGROUND

High-resolution light-emitting diode (LED) displays can include millions of micron-sized pixels arranged to form a viewing screen. For example, micro-LEDs represent an emerging display technology for flat-panel displays that offer high contrast, response times, and greater energy efficiency than other display types. Micro-LED displays are driven by an array of microscopic LEDs that are arranged to form individual pixel elements.

SUMMARY

In some embodiments, a micro-Light-Emitting-Diode (micro-LED) structure may include a first electrode configured to be coupled to a corresponding second electrode on a backplane comprising an array of micro-LED structures; an LED epilayer comprising a first side coupled to the electrode and sidewalls extending in a direction away from the backplane; and a reflective coating applied to the sidewalls of the LED epilayer.

In some embodiments, a method of fabricating a micro-LED structure may include forming an LED epilayer on a substrate where the LED epilayer may include a first side, a second side opposite the first side and adjacent to the substrate, and sidewalls. The method may also include forming a reflective coating on the sidewalls of the LED epilayer, and forming a first electrode coupled to the first side of the LED epilayer.

In some embodiments, a micro-LED array may include a backplane substrate, and a plurality of micro-LED structures mounted to the backplane substrate, where the plurality of micro-LED structures may include LED epilayers. The array may also include a plurality of pixel isolation structures formed between the plurality of micro-LED structures. The plurality of pixel isolation structures may extend above a height of the LED epilayers of the plurality of micro-LED structures. The plurality of pixel isolation structures may include reflective coatings on a portion of the plurality of pixel isolation structures that extends above the height of the LED epilayers of the plurality of micro-LED structures.

In any embodiments, any and/or all of the following features may be included in any combination and without limitation. The reflective coating may substantially cover the sidewalls of the LED epilayer to prevent light leakage out of the sidewalls of the LED epilayer. The reflective coating may further cover a portion of the first side of the LED epilayer. The reflective coating may leave an opening on the first side of the LED epilayer to which the first electrode is coupled. The micro-LED structure may also include a first dielectric layer between the LED epilayer and the reflective coating. The micro-LED structure may also include a second dielectric layer over the reflective coating. The first dielectric layer and the second dielectric layer may enclose the reflective coating to electrically isolate the reflective coating from the first electrode. The reflective coating may include a metal layer. The reflective coating may include a material from the group consisting of: Al, Rh, Pt, Ag, Au, and Cr. The reflective coating may include a plurality of layers of a Distributed Bragg Reflector (DBR). The plurality of layers of the DBR may include alternating layers of $SiO_2$ and $TiO_2$. The reflective coating may be formed to leave an opening on the first side of the LED epilayer where the first electrode is coupled to the first side of the LED epilayer. A mesa etch may be performed on the LED epilayer to form a first level comprising p-doped Gallium Nitride (GaN) and a second level comprising n-doped GaN. The first electrode may be coupled to the n-doped GaN. A second electrode may be formed that is coupled to the p-doped GaN. A dielectric layer may be formed between the reflective coating and the LED epilayer, and the dielectric layer may be etched to expose the LED epilayer where the first electrode couples to the first side of the LED epilayer. The plurality of micro-LED structures may include luminescence regions formed on the LED epilayers, where the reflective coatings may be between the luminescence regions and the plurality of pixel isolation structures. The reflective coatings on the portion of the plurality of pixel isolation structures that extends above the height of the LED epilayers may not extend below the height of the LED epilayers.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

FIGS. 3A-3D illustrate stages in a process for fabricating a micro-LED array from mounted micro-LED structures, according to some embodiments.

DETAILED DESCRIPTION

Micro-LED structures include an LED epilayer that may be formed before the micro-LED structure is coupled to a backplane substrate. In order to prevent light leakage and maximize light output, the sidewalls and other surfaces of the LED epilayer may be coated with a reflective coating. For example, the reflective coating may include a metal layer that is electrically insulated between dielectric layers from the micro-LED electrodes. The reflective coating may also be formed using multiple layers in a distributed Bragg reflector configuration. This reflective coating may be formed during the LED fabrication process before the micro-LED structure is coupled to the backplane. The pixel isolation structures on the backplane may also include a reflective coating that is applied above the LED epilayers.

Figure 1:
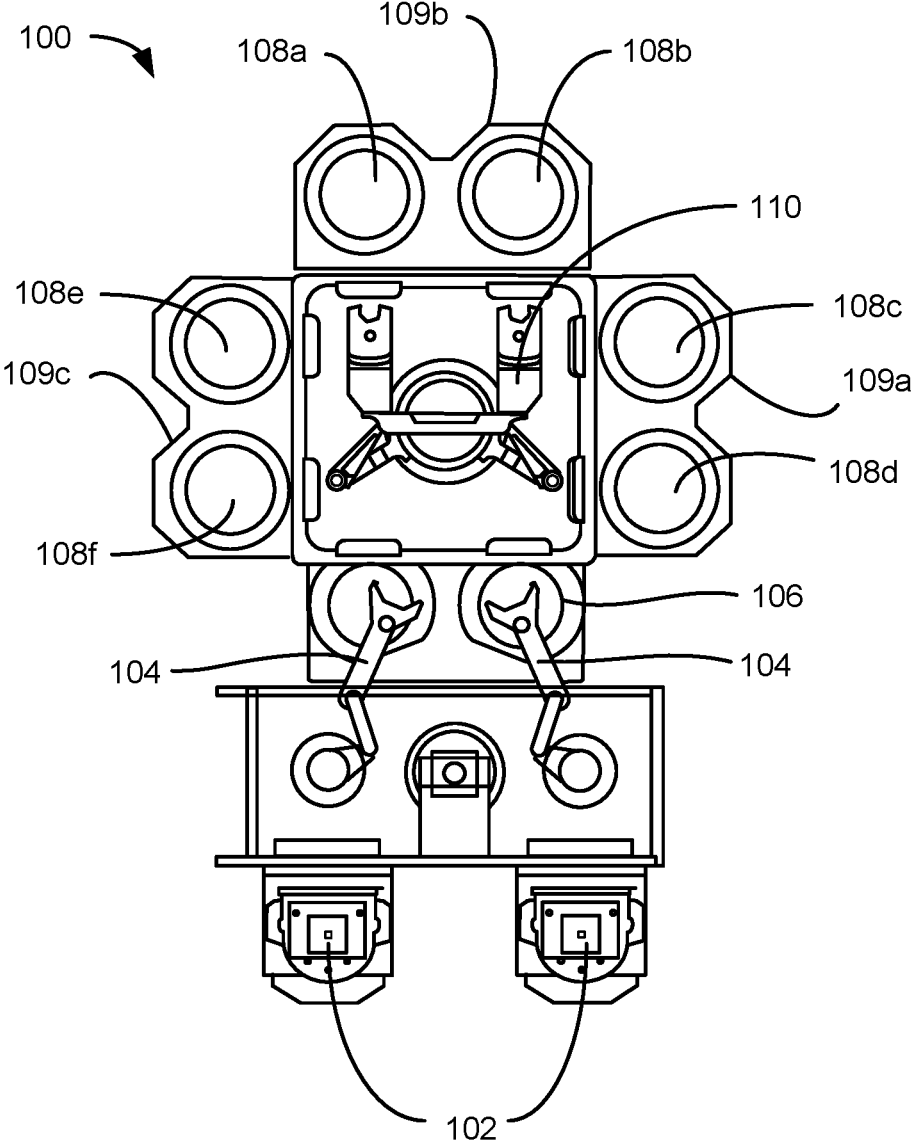
FIG. 1 illustrates a top plan view of one embodiment of a processing system of deposition, etching, baking, and curing chambers according to some embodiments.

FIG. 1 illustrates a top plan view of one embodiment of a processing system 100 of deposition, etching, baking, and curing chambers according to some embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition, atomic layer deposition, chemical vapor deposition, physical vapor deposition, etch, pre-clean, anneal, plasma processing, degas, orientation, and other substrate processes.

The substrate processing chambers 108a-f may include one or more system components for depositing, annealing, curing and/or etching a material film on the substrate or wafer. In one configuration, two pairs of the processing chambers, for example 108c-d and 108e-f, may be used to deposit material on the substrate, and the third pair of processing chambers, for example 108a-b, may be used to cure, anneal, or treat the deposited films. In another configuration, all three pairs of chambers, for example 108a-f, may be configured to both deposit and cure a film on the substrate. Any one or more of the processes described may be carried out in additional chambers separated from the fabrication system shown in different embodiments. It will be appreciated that additional configurations of deposition, etching, annealing, and curing chambers for material films are contemplated by the processing system 100. Additionally, any number of other processing systems may be utilized with the present technology, which may incorporate chambers for performing any of the specific operations. In some embodiments, chamber systems which may provide access to multiple processing chambers while maintaining a vacuum environment in various sections, such as the noted holding and transfer areas, may allow operations to be performed in multiple chambers while maintaining a particular vacuum environment between discrete processes.

The processing system 100, or more specifically chambers incorporated into the processing system 100 or other processing systems, may be used to produce structures according to some embodiments of the present technology. For example, the processing system 100 may be used to produce micro-LED arrays by performing operations such as deposition, etch, sputtering, polishing, cleaning, and so forth, in the various substrate processing chambers 108.

Figure 2:
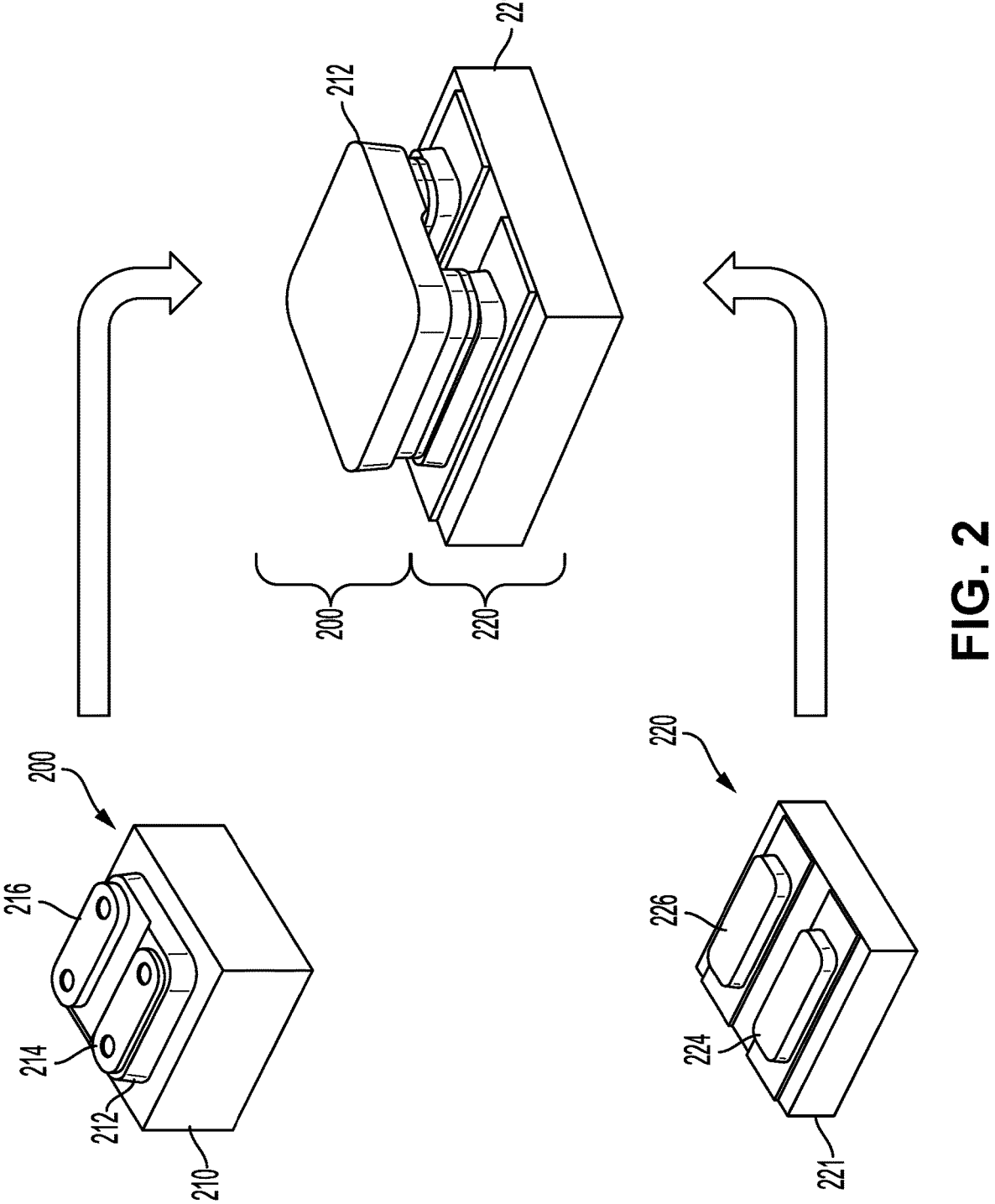
FIG. 2 illustrates a simplified process for creating a micro-LED structure that may be mounted to a backplane, according to some embodiments.

FIG. 2 illustrates a simplified process for creating a micro-LED structure 200 that may be mounted to a backplane 220, according to some embodiments. As described in greater detail below, the micro-LED structure may be fabricated on a substrate 210. An LED epilayer 212 may be formed on the substrate 210 to act as an electrical component that generates light for the micro-LED structure 200. The LED epilayer 212 may be comprised of a number of different individual layers as described below.

One or more electrodes may be mounted to the LED epilayer 212 to provide an electrical connection for the micro-LED structure 200. For example, a first electrode 214 and a second electrode 216 may be coupled to the LED epilayer 212 on a same side of the LED epilayer 212. As used herein, the side of the epilayer 212 to which the first electrode 214 is coupled may be referred to generically as a "first side" of the LED epilayer 212. Although FIG. 2 illustrates a micro-LED structure 200 having both electrodes mounted to the first side of the LED epilayer 212 in a lateral chip or "flip-chip" configuration, other embodiments may mount the first electrode 214 to the first side of the epilayer 212 while mounting the second electrode 216 to an opposite side of the epilayer 212, referred to generically as a "second side" of the LED epilayer 212 that is opposite of the first side. This may be referred to as a "vertical-chip" orientation, which is compatible with the all the embodiments described herein that utilize a reflective coating on the LED epilayer 212.

Separately, a substrate 221 may be used to form a backplane 220 of a micro-LED array. A plurality of electrodes may be coupled to the substrate 221. These electrodes may be configured to receive the electrodes on a plurality of different micro-LED structures to form electrical connections between the backplane 220 and the micro-LED structures. For example, a first electrode 224 and a second electrode 226 on the substrate 221 may be configured to be electrically coupled with the first electrode 214 and the second electrode 216 on the LED epilayer 212 of the micro-LED structure 200.

The micro-LED structure 200 may be mounted to the backplane 220 by flipping the orientation of the micro-LED structure 200 and mating the first electrode 214 and the second electrode 216 on the micro-LED structure 200 with the corresponding first electrode 224 and second electrode 226 on the substrate 221. The substrate 210 on which the LED epilayer 212 is formed may be removed to expose the LED epilayer 212 on top of the backplane 220. Although FIG. 2 illustrates only a single micro-LED structure 200 mounted to a single pair of electrodes on the backplane 220, it should be understood that the backplane 220 may be configured to mount a plurality of micro-LED structures as an array of micro-LEDs. Therefore the substrate 210 may include a plurality of LED epilayers forming a plurality of micro-LED structures that may be mounted together on the backplane 220, and the substrate 221 may include a plurality mounting locations for a plurality of micro-LED structures in an array that are not shown explicitly in FIG. 2.

FIGS. 3A-3D illustrate stages in a process for fabricating a micro-LED array from mounted micro-LED structures, according to some embodiments. These figures illustrate a cross-sectional view of the structure described above in FIG. 2. In FIG. 3A, pixel isolation structures 333 may be formed between each of the micro-LED structures in the array. These pixel isolation structures 333 may extend above a height of the LED epilayer 212 in each of the micro-LED structures. The pixel isolation structures 333 may be fabricated with reflective and/or conductive materials (e.g., a metal), and may be surrounded by electrically insulating passivation layers to prevent the pixel isolation structures 333 from shorting any of the electrodes of the micro-LED structures.

A luminescence region 302 may be formed above the LED epilayer 212 between the pixel isolation structures 333. The luminescence region 302 may include a photoluminescent material. For example, FIG. 3B illustrates how the luminescence region 302 may include a quantum dot material 304 that is operable to emit different wavelengths of light. For example, a single pixel may include a plurality of micro-LED structures, each of which may use a different quantum dot material to generate red light, blue light, green light, etc. The luminescence region 302 may be formed using thermal imprinting lithography, which may include the deposition of a subpixel isolation material on the micro-LED structures and thermal imprinting of the luminescent region 302 on the subpixel isolation material. Alternatively, the luminescence region 302 may be formed using a sequence of operations that include depositions, mask patterning, etching, and mask removal.

FIG. 3C illustrates the optional inclusion of an ultraviolet (UV) light filter 306 that may be formed on the micro-LED array. The UV light filter 306 may absorb UV light generated by the micro-LED structures in the array. In some embodiments, the UV light filter 306 may also absorb other wavelengths, such as types of blue light generated by the micro-LED structures in the array, while passing the visible light emitted from the luminescence regions for each micro-LED structure.

FIG. 3D illustrates the inclusion of a microlens 308 that may be formed on top of each of the micro-LED structures.

Figures 4, 5:
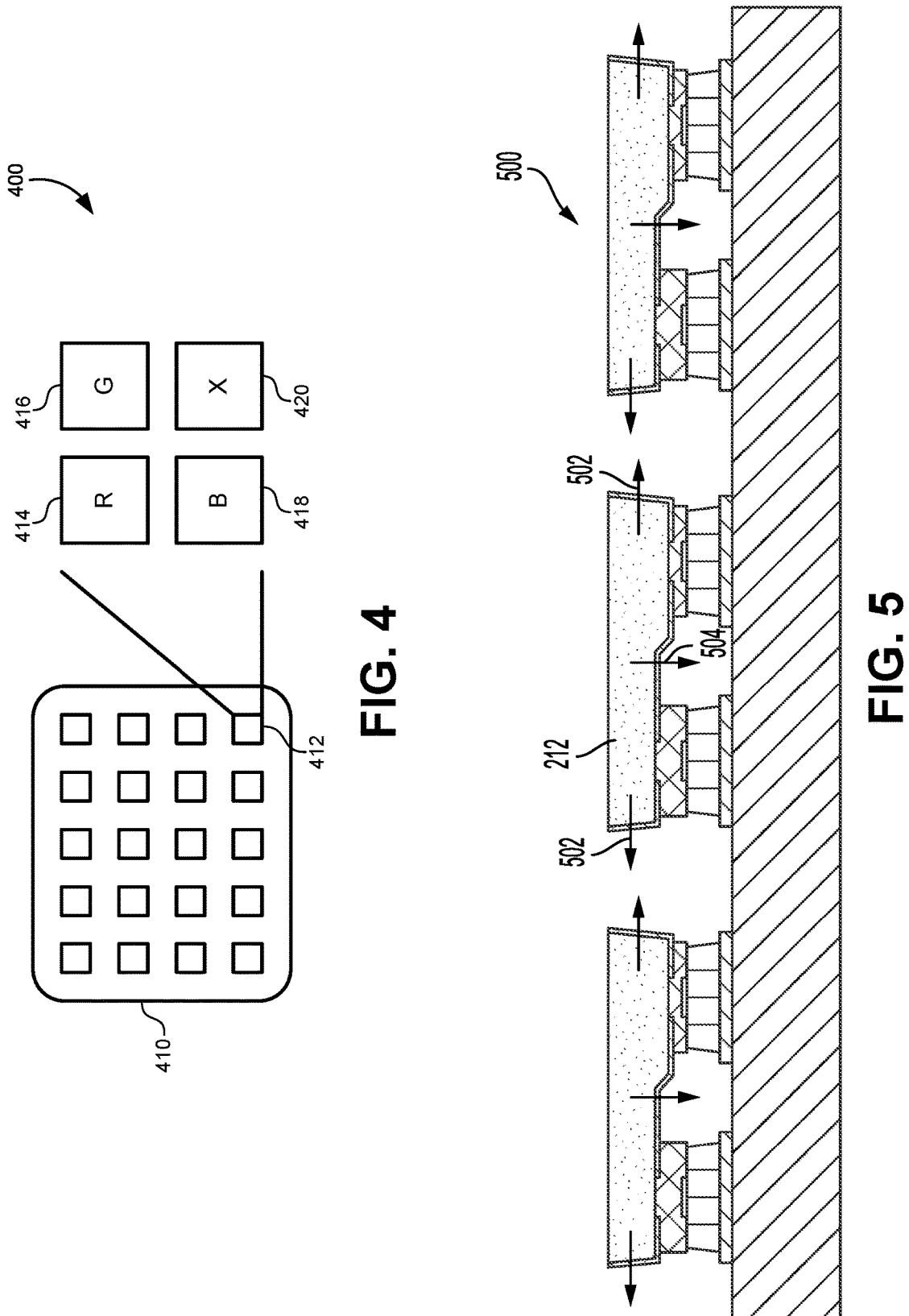
FIG. 4 illustrates a micro-LED array mounted on a backplane, according to some embodiments.
FIG. 5 illustrates a cross-sectional view of adjacent micro-LED structures in an array where light leakage between adjacent structures is present, according to some embodiments.

FIG. 4 illustrates a micro-LED array 410 mounted on a backplane, according to some embodiments. The backplane may also include electronic circuitry to regulate electrical signals and activate the illumination of micro-LEDs in the micro-LED array 410. For example, the backplane may include CMOS circuitry that includes transistors that are operable to turn on and/or off the flow of electrical current to each of the micro-LED structures in the micro-LED array 410. The micro-LED array 410 may be used to fabricate display screens and other display technology.

Each "pixel" 412 in the micro-LED array 410 may include a plurality of individual micro-LED structures. For example, some embodiments may include three or four individual micro-LED structures in each pixel 412. FIG. 4 illustrates a pixel 412 that includes four micro-LED structures. A first micro-LED structure 414 may be configured to generate red light, a second micro-LED structure 416 may be configured to generate green light, a third micro-LED structure 418 may be configured to generate blue light, and a fourth micro-LED structure 420 may be configured as a backup in case one of the other micro-LED structures in the pixel 412 fails.

Each of the four micro-LED structures in the pixel 412 may be referred to as a subpixel in the pixel 412. In some embodiments, the pixel isolation structures 333 described above may be configured as subpixel isolation structures to isolate each of the subpixels from each other within the pixel 412. In this example, each of the subpixels is arranged in a 2×2 grid array in each pixel 412, although other embodiments may use different arrangements for the subpixels within a pixel.

FIG. 5 illustrates a cross-sectional view 500 of adjacent micro-LED structures in an array where light leakage between adjacent structures is present, according to some embodiments. In existing architectures, light can leak from different areas in the micro-LED structures in the array, thereby causing interference with other neighboring micro-LED structures and reducing the light output efficiency of the micro-LED structures in the array.

One specific area where light leakage may occur in a micro-LED structure is from the LED epilayer 212. Ideally, all of the light generated by the micro-LED structure should be directed vertically in FIG. 5, directly out of the micro-LED array. However, as illustrated in FIG. 5, light may leak from various locations in the LED epilayer 212 instead of exiting through the second side of the LED epilayer 212. This light leakage may inadvertently be transmitted into an adjacent micro-LED structure and cause interference. For example, light from a micro-LED structure configured to generate blue light may leak into an adjacent micro-LED structure configured to generate red light, thereby changing the light output of a pixel or an adjacent pixel. Additionally, when light leaks from the LED epilayer 212, this reduces the total light output of the micro-LED structure, thereby causing a reduction in the sharpness/brightness of a micro-LED display.

In this example, light 502 may leak out of a sidewall of the LED epilayer 212. As depicted in FIG. 5, the "sidewall" of the LED epilayer 212 may refer to the sides of the LED epilayer 212 that extend in a direction away from the backplane. Note that the sidewalls do not need to extend in a pure vertical direction (e.g., 90°), but may instead extend away from the backplane at an angle. This angle may be adjusted in some embodiments to maximize the efficiency of the light output of the micro-LED structure as described in greater detail below. The sidewalls of the LED epilayer 212 may extend around the LED epilayer 212, even though only a cross-sectional view is illustrated in FIG. 5.

Additionally, light 504 may also leak out of the first side of the LED epilayer 212 to which the electrodes are coupled. The leakage of this light 504 may occur between the electrodes as illustrated in FIG. 5, as well as on the sides of the electrodes. Between the light 502 leaking from the sidewalls of the LED epilayer 212 and the light 504 leaking from the first side of the LED epilayer 212, improvements are needed in the design of the micro-LED structure in order to minimize this leakage, minimize interference with adjacent micro-LED structures, and increase the efficiency of the light output.

Figure 6:
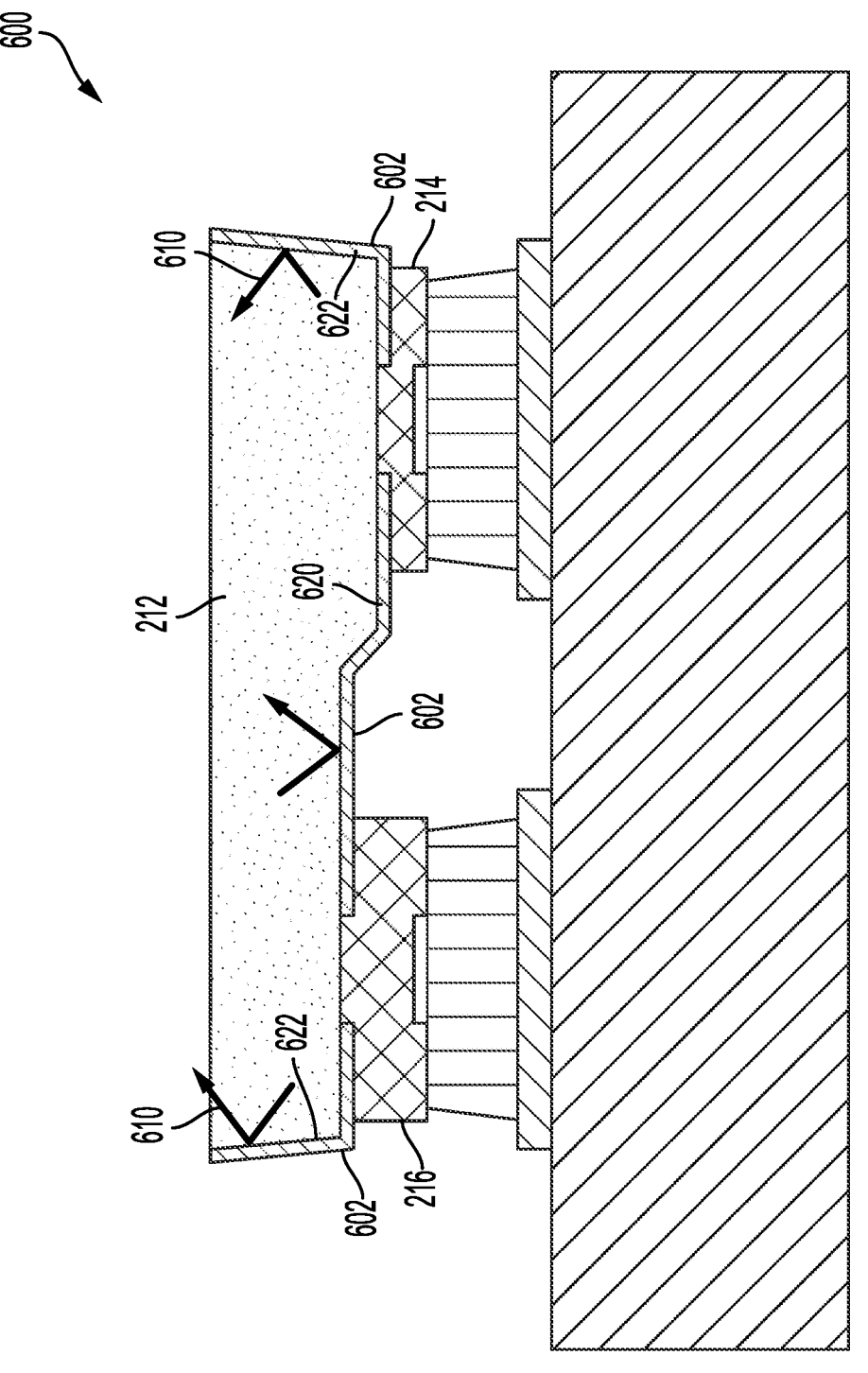
FIG. 6 illustrates an LED epilayer that includes a reflective coating, according to some embodiments.

FIG. 6 illustrates an LED epilayer 212 that includes a reflective coating 602, according to some embodiments. To solve the problem of light leakage, along with other technical problems, some embodiments may form a reflective coating 602 around the LED epilayer 212 to reduce the light leakage described above. Instead of relying on pixel isolation structures or other structures that are formed after the micro-LED structures are formed, these embodiments instead integrate a reflective coating 602 on a surface of the LED epilayer 212 during the fabrication of the micro-LED structure itself. For example, turning back briefly to FIG. 2, the reflective coating 602 may be formed on the LED epilayer 212 while the LED epilayer 212 is still coupled to the substrate 210 and before the first electrode 214 and/or the second electrode 216 are formed on the LED epilayer 212. The reflective coating 602 may also be characterized in that the reflective coating 602 is formed on the LED epilayer 212 before the micro-LED structure 200 is mounted to the backplane 220. Therefore, instead of using reflective layers or absorption layers that are later inserted between micro-LED structures on the backplane using complicated processes, these embodiments greatly simplify this process during the LED processing step itself.

In some embodiments, the reflective coating 602 may be formed on the sidewalls 622 of the LED epilayer 212. Optionally, some embodiments may also apply the reflective coating 602 such that the reflective coating 602 covers portions of the first side 620 of the LED epilayer 212. For example, the reflective coating 602 may cover portions of the first side 620 of the LED epilayer 212 between the first electrode 214 and/or the second electrode 216, while leaving an opening where a portion of the LED epilayer 212 may be exposed where the first electrode 214 and/or the second electrode 216 may interface or be coupled with the LED epilayer 212 to avoid interfering with this electrical connection.

In some embodiments, the reflective coating 602 may substantially cover the sidewalls 622 of the LED epilayer 212 to prevent light leakage out of the sidewalls 622. For example, substantially covering the sidewalls 622 may include covering greater than or about 80% of the surface area of the sidewalls 622. In other embodiments, the reflective coating 602 may cover about 100% of the surface area, greater than or about 90% of the surface area, greater than or about 70% of the surface area, greater than or about 60% of the surface area, greater than or about 50% of the surface area, greater than or about 40% of the surface area, and so forth.

Figures 7A, 7B, 7C, 7D, 7E, 7F, 7G, 7H:
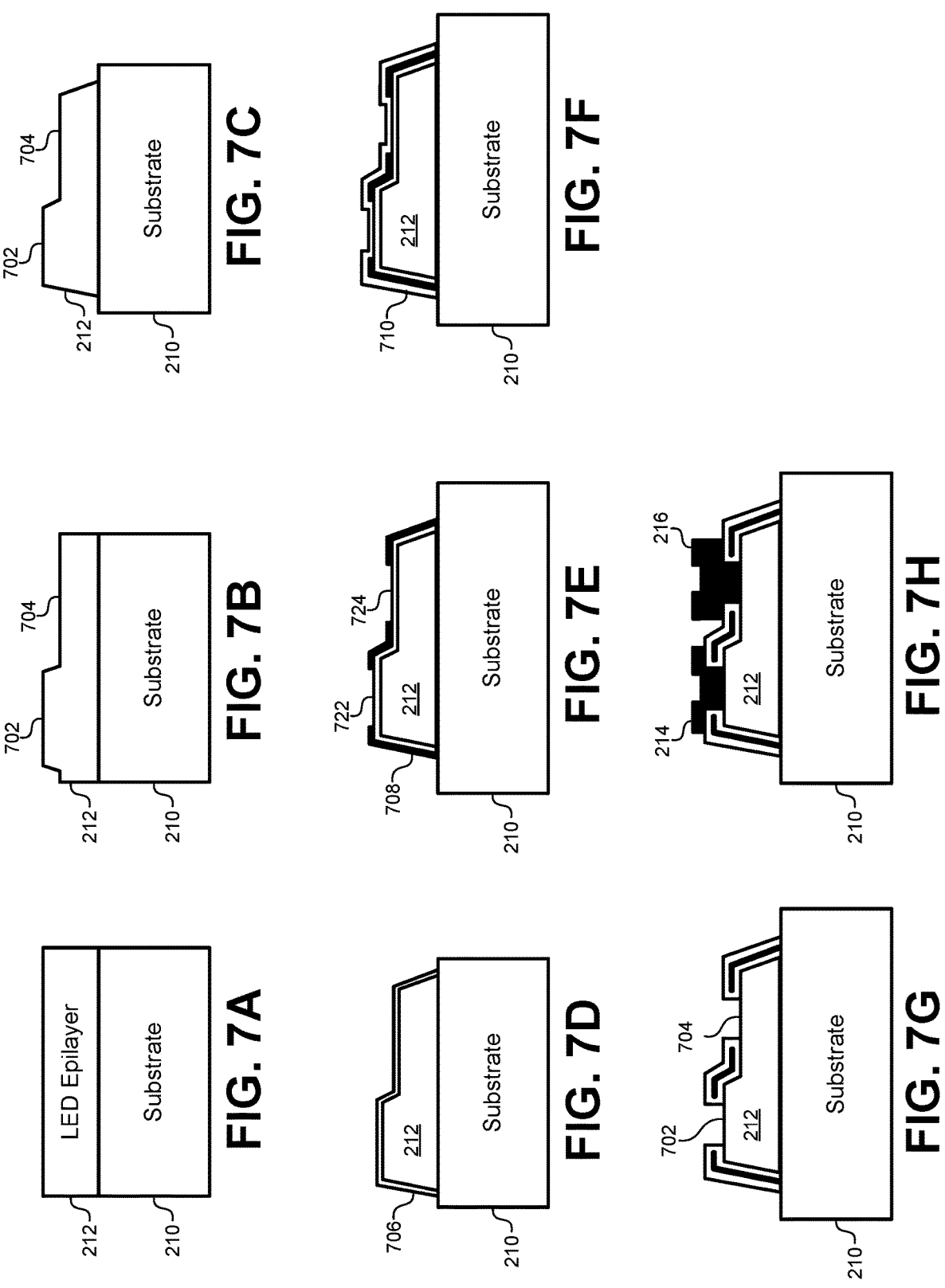
FIG. 7A-7H illustrate a series of processing steps that may be used to form the LED epilayer and the reflective coating, according to some embodiments.

FIG. 7A-7H illustrate a series of processing steps that may be used to form the LED epilayer 212 and the reflective coating 708, according to some embodiments. FIG. 7A shows a substrate 210 upon which an LED epilayer 212 is formed. The substrate 210 may include silicon or sapphire, among other substrate materials. These steps may be referred for to as micro-LED fabrication steps, and may be distinguished from other steps described above in FIG. 3 where the micro-LED is mounted to a backplane, arranged in pixels, surrounded by pixel isolation structures, covered in luminance material, and so forth.

Although the LED epilayer 212 is shown as a single layer in these figures, it should be understood that the LED epilayer 212 may in fact be formed using a plurality of continuous layers that are built up on the substrate 210. For example, the LED epilayer 212 may include a gallium-and-nitrogen-containing LED structure. The LED epilayer 212 may be a gallium nitride (GaN) LED structure that is epitaxially formed on the substrate 210. The LED epilayer 212 may include an n-doped GaN layer and a p-doped GaN layer. Formed between the n-doped and p-doped GaN layers may be a multiple-quantum-well (MQW) region where the light emitted by the LED epilayer 212 is generated.

FIG. 7B shows how a mesa etch process may be used to expose two different surfaces in the LED epilayer 212 that may be coupled to corresponding electrodes or electrical contacts. For example, the mesa process may expose a p-doped GaN surface 702 on one portion of the LED epilayer 212. By etching away a portion of the p-doped GaN surface (along with any intervening layers, such as an MQW region), a portion of an underlying n-doped GaN layer may be exposed to form an n-doped GaN surface 704. Any type of etch process may be used to expose these surfaces, including photolithography, reactive ion etches, and so forth.

FIG. 7C illustrates a result of a die singulation process to form the sidewalls of the LED epilayer 212. In some embodiments, the sidewalls may be formed at an angle. This angle may be configured such that the light generated by the micro-LED structure that is incident on the sidewalls of the LED epilayer 212 may be maximally reflected off of the sidewalls of the LED epilayer 212 through the microlens associated with the micro-LED structure. When the reflective coating 708 is added, the sidewalls may internally reflect light that would otherwise escape from the LED epilayer 212. The angle of the sidewall may be configured such that this reflective light exits the microlens with maximum efficiency. The precise angle of the sidewall may depend upon the specific physical characteristics of each individual micro-LED design. For example, in comparison to a pure vertical sidewall of 90°, some embodiments may instead use a sidewall angle that is greater than or about 85°, greater than or about 80°, greater than or about 75°, greater than or about 70°, greater than or about 65°, greater than or about 60°, greater than or about 55°, greater than or about 50°, greater than or about 45°, and/or any interval within these ranges.

FIG. 7D illustrates a first dielectric layer 706 that may be formed on the first surface and sidewalls of the LED epilayer 212. The first dielectric layer 706 may be formed from any dielectric material, such as silicon dioxide or other oxide materials. The first dielectric layer 706 may form an insulating layer that isolates the reflective coating 708 from the first electrode 214 and the second electrode 216. The first dielectric layer 706 may be formed using a number of different deposition processes, such as chemical vapor deposition (CVD), atomic layer deposition (ALD), plasma-enhanced chemical vapor deposition (PECVD), and/or any other deposition process. The first dielectric layer 706 illustrated in these figures substantially covers the exposed portions of the LED epilayer 212 that are exposed above the substrate 210.

FIG. 7E illustrates the application of the reflective coating 708. The reflective coating 708 may be formed from any reflective material. Some embodiments may specifically use a metal to implement the reflective coating 708. For example, metals such as aluminum (Al), rhodium (Rh), platinum (Pt), silver (Ag), gold (Au), chromium (Cr), and/or other similar metals may be used to form the reflective coating 708. The reflective coating 708 may be formed using sputtering or other deposition processes.

As illustrated in these figures, the reflective coating 708 may be formed on top of the first dielectric layer 706. The reflective coating 708 may cover some and/or substantially all of the sidewalls of the LED epilayer 212 and/or the first dialectic layer 706. Additionally, the reflective coating 708 may cover a portion of the first or top surface of the LED epilayer 212. In some embodiments, the reflective coating 708 may be applied such that openings 722, 724 may leave a portion of the first dielectric layer 706 above the p-doped GaN surface 702 and the n-doped GaN surface 704 exposed. As will be described below, the first dielectric layer 706 may be etched away from these openings 722, 724 to expose the p-doped GaN surface 702 and the n-doped GaN surface 704 for an electrical connection with the first electrode 214 and the second electrode 216.

FIG. 7F illustrates how a second dielectric layer 710 may be applied over the reflective coating 708. The second dielectric layer 710 may be applied in a manner similar to that described above for the first dielectric layer 706. The second dielectric layer 710 may cover substantially all of the reflective coating 708. Thus, the second dielectric layer 710 and the first dielectric layer 706 may insulate or enclose the reflective coating 708 such that the reflective coating 708 does not contact the first electrode 214 and/or the second electrode 216.

FIG. 7G illustrates how the first dielectric layer 706 and the second dielectric layer 710 may be etched or otherwise removed in order to expose the p-doped GaN surface 702 and the n-doped GaN surface 704. The first dielectric layer 706 and the second dielectric layer 710 may be removed using any etch process. Note that the reflective coating 708 remains enclosed in the first dialectic layer 706 and the second dielectric layer 710.

FIG. 7H illustrates how the first electrode 214 and the second electrode 216 may be formed on the micro-LED structure. For example, the first electrode 214 and the second electrode 216 may be formed during a metallization process wherein metals deposited over the p-doped GaN surface 702 and the n-doped GaN surface 704. In some embodiments, a mask for depositing the metals for the first electrode 214 and the second electrode 216 may expose the p-doped GaN surface 702 and the n-doped GaN surface 704, as well as a portion of the second dielectric layer 710. This may allow the first electrode 714 and/or the second electrode 716 to extend above the height of the second dielectric layer 710 and be formed on top of a portion of the second dielectric layer 710.

The electrically first electrode 214 forms conductive a pathway for electrical current to pass through the p-doped GaN layer of the LED epilayer 212. Similarly, the second electrode 216 forms a conductive pathway for electrical current to pass through the n-doped GaN layer. First electrode 214 and the second electrode 216 may later be connected to control circuitry of the backplane. Electrical signals from the control circuitry create a flow of electrical current through the micro-LED structure that causes light emission from the MQW regions of the structures. The MQW region may be formed to emit light characterized by a repeatable peak intensity wavelength and quantum efficiency for an applied electrical signal (e.g., electrical current and/or voltage).

Figure 8:
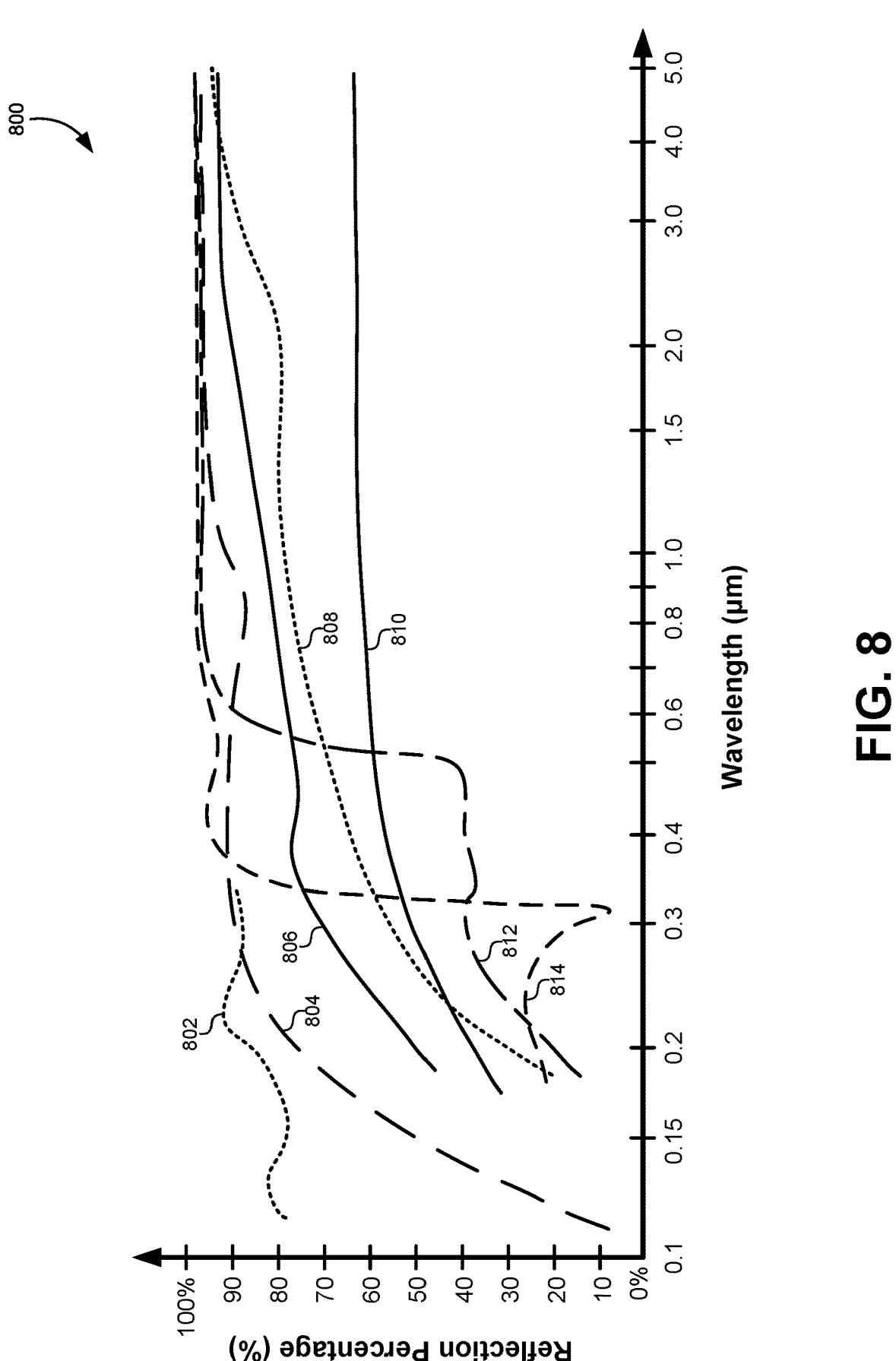
FIG. 8 illustrates a graph of a reflection percentage for different materials used as the reflective coating, according to some embodiments.

FIG. 8 illustrates a graph 800 of a reflection percentage for different materials used as the reflective coating, according to some embodiments. The y-axis represents a reflection percentage of some of the many materials that may be used for the reflective coating, while the x-axis represents a wavelength (μm) of the light that the reflective coating can reflect at the corresponding percentage shown on the y-axis. The graph 800 may be used to select a material to be used for the reflective coating based on the requirements of a specific design. For example, based on the wavelength of the particular micro-LED structure and requirements of the design, graphic 800 may be used to select, materials such as Al-VUV (curve 802), Al (curve 804), Rh (curve 806), Pt (curve 808), Cr (curve 810), Au (curve 812), Ag (curve 814), and/or other materials. Note that the materials describing graph 800 are provided only by way of example and are not meant to be limiting. Any reflective material or metal may be used.

FIGS. 9A-9E illustrate a process for applying a reflective coating that includes a Distributed Bragg Reflector (DBR), according to some embodiments. A DBR may include a structure that is formed from multiple layers of alternating materials with varying reflective indices. Each layer boundary may cause a partial reflection of an optical wave, such that the multiple layers act as a high-quality reflector. Some embodiments may substitute the metal material described above for the reflective coating to instead use a plurality of layers forming a DBR as the reflective coating.

Figure 9:
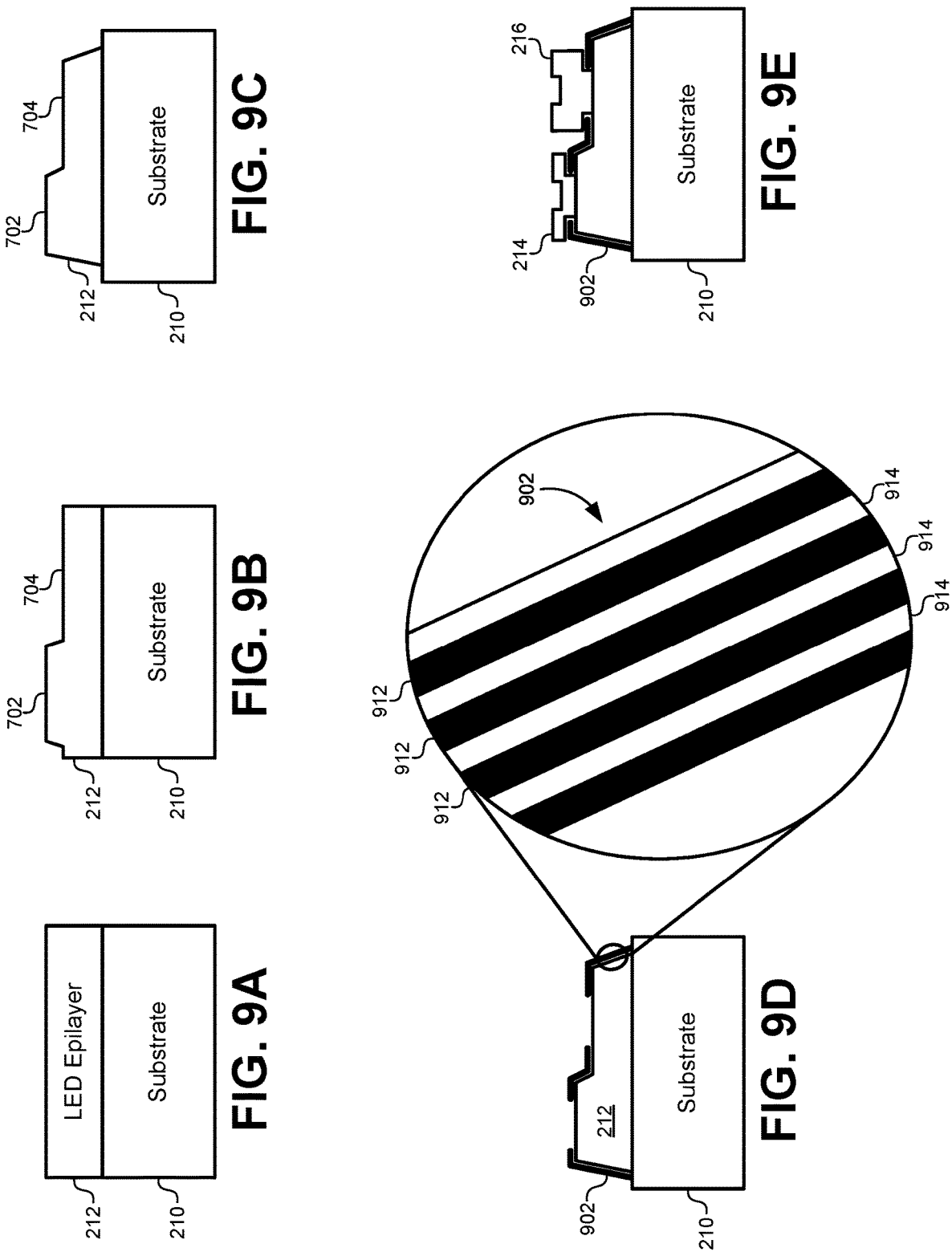
FIGS. 9A-9E illustrate a process for applying a reflective coating that includes a Distributed Bragg Reflector (DBR), according to some embodiments.

The processes resulting the structures illustrated in FIGS. 9A-9C may be carried out as described above in relation to FIGS. 7A-7C to form the LED epilayer 212 on the substrate 210 having an exposed p-doped GaN surface 702 and an exposed n-doped GaN surface 704 and to form the sidewalls of the LED epilayer 212.

However, instead of forming the first dielectric layer 706 and/or the second dielectric layer 710, this process may instead form a plurality of individual layers that make up the DBR as a reflective coating 902. Note that the plurality of individual layers that make up the DBR may be non-conductive. This may limited the need for the first dielectric layer 706 and/or the second dielectric layer 710 to insulate the reflective coating 902. Rather than etching away the plurality of individual layers that make up the DBR, these layers can instead be selectively formed on the LED epilayer 212 to leave the p-doped GaN surface 702 and the n-doped GaN surface 704 exposed. Electrical isolation between the reflective coating 902 and the first electrode 214 and the second electrode 216 may not be necessary.

Figure 10:
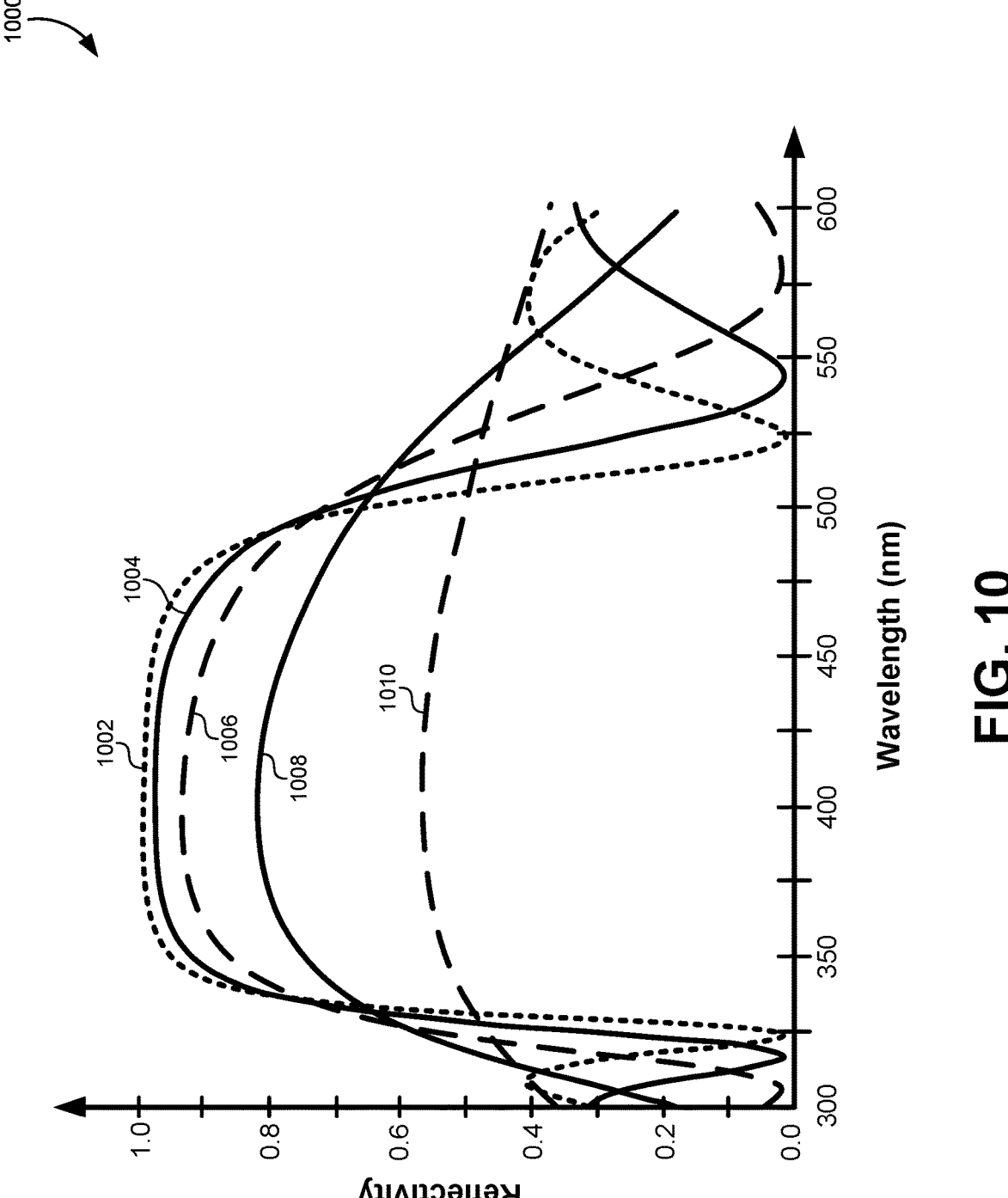
FIG. 10 illustrates a graph showing the performance of different numbers of alternating pairs of material used in the DBR of the reflective coating, according to some embodiments.

Various materials may be used to form the plurality of individual layers that make up the DBR for the reflective coating 902. For example, some embodiments may use alternating layers of silicon dioxide ($SiO_2$) 912 and titanium oxide ($TiO_2$) 914. FIG. 10 illustrates a graph 1000 showing the performance of different numbers of alternating pairs of material used in the DBR of the reflective coating 902, according to some embodiments. The reflectivity of the various layer counts is represented on the vertical axis for different light wavelengths represented on the horizontal axis. Graphs or data tables such as graph 1000 may be used to select a number of DBR layers that should be used in order to achieve a desired level of reflectivity as needed based on the operating conditions of different embodiments. For example, curve 1010 may represent a single pair of DBR layers of $SiO_2$ and $TiO_2$ (where $\lambda_{Bragg}$=400 nm, $n_{SIO2}$=1.47, $n_{TiO2}$=2.47, and $n_{GaN}$=2.50) to achieve about 50% reflectivity at 400 nm. Curve 1008 may represent two pairs of DBR layers to achieve about 80% reflectivity. Curve 1006 may represent three pairs of DBR layers to achieve about 90% reflectivity. Curve 1004 may represent four pairs of DBR layers to achieve about 95% reflectivity. Curve 1002 may represent five pairs of DBR layers to achieve about 98% reflectivity. Note that these curves in graph 1000 are provided only by way of example and are not meant to be limiting. Other DBR layer materials, layer organizations, and/or wavelength ranges may be used without limitation.

Figure 11:
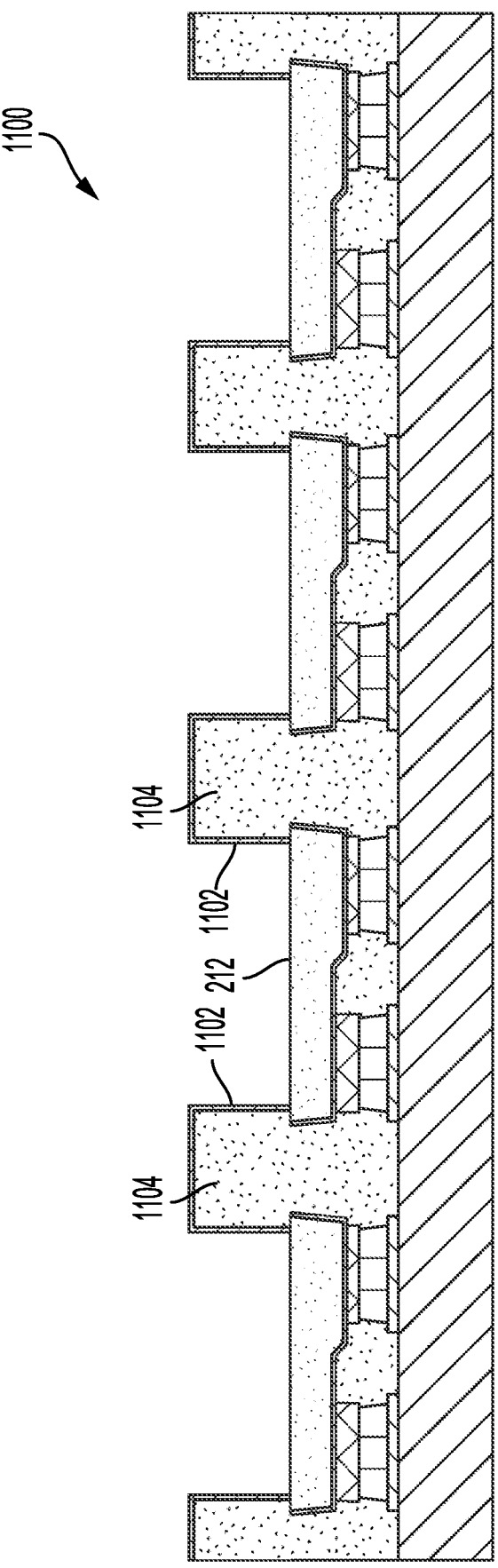
FIG. 11 illustrates a micro-LED array, according to some embodiments.

FIG. 11 illustrates a micro-LED array 1100, according to some embodiments. As described above, a plurality of micro-LED structures may be mounted to a backplane substrate, where each of the micro-LED structures includes LED epilayers 212 formed as described above. These LED epilayers 212 may include reflective coatings that cover at least a portion of the sidewalls and/or the first side of the LED epilayers 212.

Additionally, the individual micro-LED structures may include pixel isolation structures 1104, which may also be referred to as "subpixel" isolation structures depending on the arrangement of micro-LED structures relative to the pixel isolation structures 1104. The pixel isolation structures 1104 may extend above and/or around the micro-LED structure. In some embodiments, the sidewalls of the pixel isolation structures 1104 do not need to extend in a pure vertical direction (eg 90°), but may instead extend with an angle greater or smaller than 90° so the light emission direction from the micro-LED structures can be guided into desired patterns in order to form and contain the light in the photoluminescent material in these regions. The pixel isolation structures 1104 may extend adjacent to and below the contact regions for the electrodes of the micro-LED structure and may further extend down to the backplane of the micro-LED array 1100. The subpixel isolation structures may include a dielectric material, among other types of materials. The dielectric material may include one or more of silicon oxide, silicon nitride, silicon carbide, a photoresist material, or a dielectric organic-polymer material, among other dielectric materials. The pixel isolation structures 1104 may have a height of greater than or about 2.5 μm, greater than or about 5 μm, greater than or about 7.5 μm, greater than or about 10 μm, greater than or about 12.5 μm, greater than or about 15 μm, greater than or about 17.5 μm, greater than or about 20 μm, or more. The pixel isolation structures 1104 may have a width of greater than or about 1 μm, greater than or about 2 μm, greater than or about 3 μm, greater than or about 4 μm, greater than or about 5 μm, greater than or about 6 μm, greater than or about 7 μm, greater than or about 8 μm, greater than or about 9 μm, greater than or about 10 μm, or more. The pixel isolation structures 1104 may have a height-to-width aspect ratio that is greater than or about 1.5:1, greater than or about 2:1, greater than or about 2.5:1, greater than or about 3:1, greater than or about 3.5:1, greater than or about 4:1, greater than or about 4.5:1, greater than or about 5:1, or more.

In contrast to existing designs, some embodiments may further include a reflective coating 1102 that is formed on the pixel isolation structures 1104. The reflective coating 1102 may be formed as described above for any of the reflective coatings that may also be present on the LED epilayer 212. Note that because a separate reflective coating was previously applied to the LED epilayer 212 during the separate micro-LED fabrication process, the reflective coating 1102 on the pixel isolation structures 1104 need not extend below the top-level or surface level of the LED epilayer 212. Instead, the pixel isolation structures 1104 may include a reflective coating 1102 on a portion of the pixel isolation structures 1104 that extends above the height of the LED epilayers 212. Consequently, the pixel isolation structures 1104 may omit or eliminate any reflective material or coating that would otherwise be applied or used below the height of the LED epilayer 212. Thus, some embodiments may be characterized in that a portion of the pixel isolation structures 1104 below the height of the LED epilayer 212 does not include a reflective material, reflective surface, and/or reflective coating.

Using the reflective coating on the LED epilayer 212 along with the reflective coating 1102 on the pixel isolation structures 1104 provides a number of technical advantages and improvements. For example, dielectric or nonreflective materials may be used to form the pixel isolation structures

1104 instead of metallic or otherwise reflective surfaces or materials. The pixel isolation structures 1104 may be formed of a single material rather than a core metal column that is surrounded by insulating material. The reflective coating 1102 also may be applied in a simple process after the pixel isolation structures 1104 have been formed. For example, a mask may be applied over the LED epilayer 212, and the reflective coating 1102 may be applied (e.g. by sputtering or other deposition process) on the exposed portions of the pixel isolation structures 1104. This process is significantly simpler than attempting to apply a reflective coating 1102 that extends below the height of the LED epilayer 212.

Figure 12:
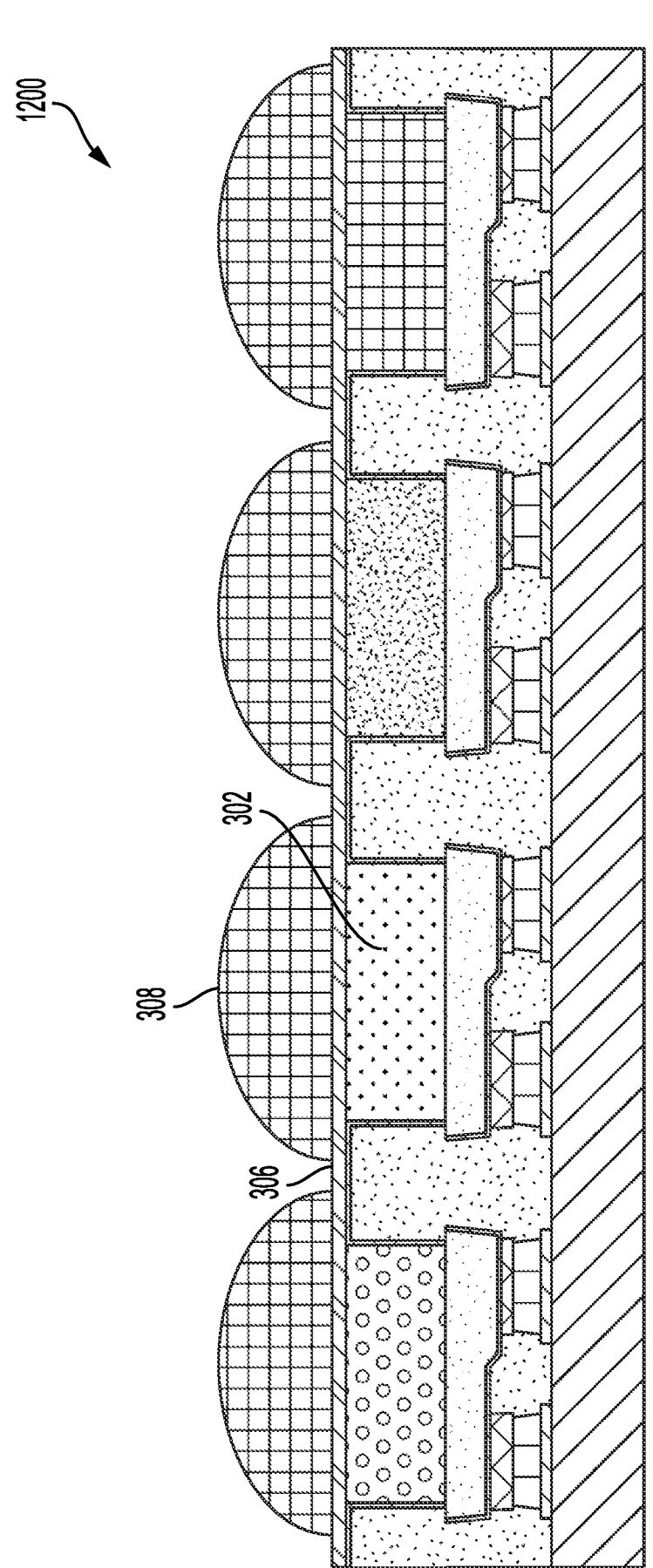
FIG. 12 illustrates a completed micro-LED array, according to some embodiments.

FIG. 12 illustrates a completed micro-LED array 1200, according to some embodiments. As described above, the luminescence region 302 may be formed based on a desired light output for each of the micro-LED structures. Forming the luminescence region 302 may include depositing photoluminescent precursors in the regions between the pixel isolation structures 1104. The photoluminescent precursors may be a mixture or slurry that includes a photo-curable fluid and one or more photoluminescent particles or compounds. The one or more photoluminescent compounds may include quantum dot materials that are operable to emit light with specific color characteristics when excited by a source light. These quantum-dot materials may include nanoparticles made of one or more kinds of inorganic semiconductor materials such as indium phosphide, zinc selenide, zinc sulfide, silicon, silicates, and graphene, and doped inorganic oxides, among other semiconductor materials. The photocurable fluid may include one or more cross-linkable compounds, a photo-initiator, and a color conversion agent. The cross-linkable compounds may include monomers that form a polymer when cured. The monomers may include acrylate monomers, methacrylate monomers, and acrylamide monomers. The cross-linkable compounds may include a negative photoresist material such as SU-8 photoresist. The photoinitiator may include phosphine oxide compounds and keto compounds, among other kinds of photo-initiator compounds that generate radicals that initiate the curing of unsaturated compounds when excited by UV light. Commercially available photo-initiator compounds include Irgacure 184, Irgacure 819, Darocur 1173, Darocur 4265, Darocur TPO, Omnicat 250, and Omnicat 550, among other photo-initiators. Forming the photoluminescent material may include curing the photoluminescent precursor to form a photoluminescent material in the luminescence region 302. The curing operation may include selectively exposing the photoluminescent precursor in one of the photoluminescent regions to a curing light that coverts the photoluminescent precursor into the photoluminescent material. A UV light filter may then be formed on top of the luminescence regions 302 and the pixel isolation structures, and microlenses 308 may be formed for each subpixel to complete the micro-LED array 1200.

Figure 13:
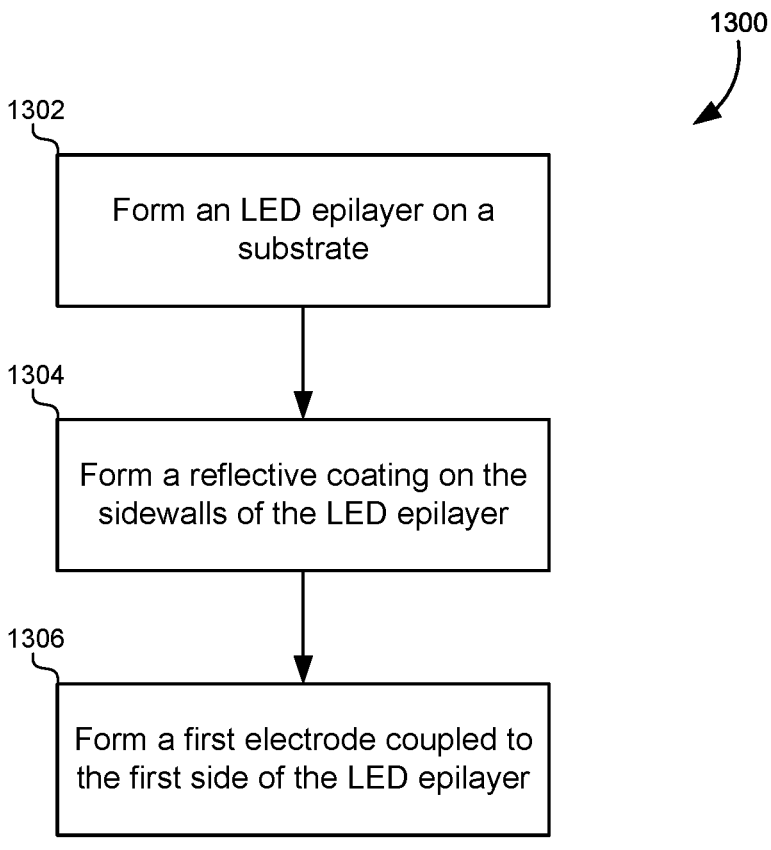
FIG. 13 illustrates a flowchart of a method for fabricating a micro-LED structure, according to some embodiments.

FIG. 13 illustrates a flowchart 1300 of a method for fabricating a micro-LED structure, according to some embodiments. The method may include forming an LED epilayer on the substrate (1302). The LED epilayer may be formed as described above in FIG. 2, FIGS. 7A-7H, and elsewhere in this disclosure. For example, the LED epilayer may include a first side where one or more electrodes are coupled, a second side that is opposite the first side and adjacent to a substrate on which the LED epilayer is formed. The LED epilayer may also include sidewalls that extend away from the first side (or away from a backplane when mounted to the backplane). As described above, the LED epilayer may be formed by a series of internal layers, including various n/p-doped GaN layers and MQW regions.

The method may also include forming a reflective coating on the sidewalls of the LED epilayer (1304). The reflective coating may be formed using a reflective material, such as a metal between one or more dielectric layers as described above in FIGS. 7A-7H. Alternatively, the reflective material may be formed using one or more layer pairs to form a DBR as described above in FIGS. 9A-9E.

The method may additionally include forming a first electrode coupled to the first side of the LED epilayer (1306). Optionally, the method may include forming a second electrode that is also coupled to the first side of the LED epilayer. Other embodiments may form the second electrode on an opposite side of the LED epilayer.

It should be appreciated that the specific steps illustrated in FIG. 13 provide particular methods of fabricating a micro-LED structure according to various embodiments. Other sequences of steps may also be performed according to alternative embodiments. For example, alternative embodiments may perform the steps outlined above in a different order. Moreover, the individual steps illustrated in FIG. 13 may include multiple sub-steps that may be performed in various sequences as appropriate to the individual step. Furthermore, additional steps may be added or removed depending on the particular applications. Many variations, modifications, and alternatives also fall within the scope of this disclosure.

As used herein, the terms "about" or "approximately" or "substantially" may be interpreted as being within a range that would be expected by one having ordinary skill in the art in light of the specification.

In the foregoing description, for the purposes of explanation, numerous specific details were set forth in order to provide a thorough understanding of various embodiments. It will be apparent, however, that some embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Specific details are given in the foregoing description to provide a thorough understanding of the embodiments. However, it will be understood that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

In the foregoing specification, features are described with reference to specific embodiments thereof, but it should be recognized that not all embodiments are limited thereto. Various features and aspects of some embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

Additionally, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMS, EPROMS, EEPROMs, magnetic or optical cards, flash memory, or other types of machine-readable mediums suitable for storing electronic instructions. Alternatively, the methods may be performed by a combination of hardware and software.

The term "computer-readable medium" includes, but is not limited to portable or fixed storage devices, optical storage devices, wireless channels and various other mediums capable of storing, containing, or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

What is claimed is:

1. A pixel, comprising:
   a backplane;
   light-emitting diodes (LEDs) disposed on the backplane, each LED having:
   a first electrode coupled to a second electrode on the backplane;
   an LED epilayer having a first side coupled to the first electrode and sidewalls extending in a direction away from the backplane;

a reflective coating disposed over the sidewalls of the LED epilayer, wherein the reflective coating comprises a plurality of layers of a Distributed Bragg Reflector (DBR); and a first dielectric layer between the LED epilayer and the reflective coating;

isolation structures, the isolation structures defining wells of subpixels, each well including a respective LED between adjacent isolation structures; and the subpixels, each subpixel having a color conversion material disposed in the wells.

2. The pixel of claim 1, wherein the reflective coating substantially covers the sidewalls of the LED epilayer to prevent light leakage out of the sidewalls of the LED epilayer.

3. The pixel of claim 1, wherein the reflective coating further covers a portion of the first side of the LED epilayer.

4. The pixel of claim 3, wherein the reflective coating leaves an opening on the first side of the LED epilayer through which the first electrode is coupled.

5. The pixel of claim 1, further comprising a second dielectric layer over the reflective coating.

6. The pixel of claim 5, wherein the first dielectric layer and the second dielectric layer enclose the reflective coating to electrically isolate the reflective coating from the first electrode.

7. The pixel of claim 1, wherein the reflective coating comprises a metal layer.

8. The pixel of claim 1, wherein the reflective coating comprises a material from the group consisting of: Al, Rh, Pt, Ag, Au, and Cr.

9. The pixel of claim 1, wherein the plurality of layers of the DBR comprises alternating layers of $SiO_2$ and $TiO_2$.

10. A method of fabricating a micro-LED structure, the method comprising:

performing a mesa etch on an LED epilayer to form a first level comprising p-doped Gallium Nitride (GaN) and a second level comprising n-doped GaN;

forming light-emitting diodes (LEDs) disposed on a backplane, each LED having:

a first electrode coupled to a second electrode on the backplane;

an LED epilayer having a first side coupled to the first electrode and sidewalls extending in a direction away from the backplane;

a reflective coating disposed over the sidewalls of the LED epilayer; and a first dielectric layer between the LED epilayer and the reflective coating;

forming isolation structures, the isolation structures defining wells of subpixels, each well including a respective LED between adjacent isolation structures; and forming the subpixels, each subpixel having a color conversion material disposed in the wells.

11. The method of claim 10, further comprising selectively forming the reflective coating to leave an opening on the first side of the LED epilayer where the first electrode is coupled to the first side of the LED epilayer.

12. The method of claim 10, wherein the first electrode is coupled to the n-doped GaN.

13. The method of claim 12, further comprising forming a third electrode coupled to the p-doped GaN.

14. The method of claim 10, further comprising:

forming a dielectric layer between the reflective coating and the LED epilayer; and etching the dielectric layer to expose the LED epilayer where the first electrode couples to the first side of the LED epilayer.

15. A display comprising:

a backplane substrate;

a plurality of pixels mounted to the backplane substrate, wherein each of the plurality of pixels comprises a plurality of subpixels, and each of the plurality of subpixels comprises an LED disposed on the backplane, each LED comprising:

a first electrode coupled to a second electrode on the backplane;

an LED epilayer having a first side coupled to the first electrode and sidewalls extending in a direction away from the backplane;

a reflective coating disposed over the sidewalls of the LED epilayer;

a first dielectric layer between the LED epilayer and the reflective coating;

isolation structures, the isolation structures defining wells of subpixels, each well including a respective subpixel between adjacent isolation structures;

luminescence regions formed on the LED epilayers; and second reflective coatings between the luminescence regions and the isolation structures.

16. The display of claim 15, wherein the second reflective coatings cover a portion of the plurality of pixel isolation structures that extends above the height of the LED epilayers.

* * * * *